United States Patent
Lechner et al.

(10) Patent No.: US 7,105,827 B2
(45) Date of Patent: Sep. 12, 2006

(54) SEMICONDUCTOR DETECTOR WITH OPTIMISED RADIATION ENTRY WINDOW

(75) Inventors: Peter Lechner, Holzkirchen (DE); Gerhard Lutz, Munich (DE); Lothar Strueder, Munich (DE)

(73) Assignee: Max-Planck-Gesellschaft zur Foerderung der Wissenschaften E.V., Munich (DE)

( * ) Notice: Subject to any disclaimer, the term of this patent is extended or adjusted under 35 U.S.C. 154(b) by 297 days.

(21) Appl. No.: 10/741,198

(22) Filed: Dec. 19, 2003

(65) Prior Publication Data

US 2004/0149919 A1 Aug. 5, 2004

(30) Foreign Application Priority Data

Dec. 20, 2002 (DE) ............... 102 60 229

(51) Int. Cl.
*G01T 1/24* (2006.01)
(52) U.S. Cl. ............... 250/370.01; 250/370.13
(58) Field of Classification Search ......... 250/370.01, 250/370.02, 370.05, 385.1, 338.4, 370.13; 257/428, 457
See application file for complete search history.

(56) References Cited

U.S. PATENT DOCUMENTS

| 4,688,067 | A | | 8/1987 | Rehak et al. | |
|---|---|---|---|---|---|
| 4,885,620 | A | * | 12/1989 | Kemmer et al. | 257/428 |
| 6,455,858 | B1 | * | 9/2002 | Patt et al. | 250/370.14 |
| 6,521,894 | B1 | * | 2/2003 | Iwanczyk et al. | 250/370.11 |
| 6,794,654 | B1 | * | 9/2004 | Hansen et al. | 250/370.09 |
| 2002/0079456 | A1 | * | 6/2002 | Lingren et al. | 250/370.01 |
| 2002/0139970 | A1 | | 10/2002 | Iwanczyk et al. | |

FOREIGN PATENT DOCUMENTS

DE 10213812 A1 3/2002
WO PCT/DE85/00134 4/1985

OTHER PUBLICATIONS

Florini, C., et al; "Single-Side Blasing of Silicon Drift Detectors with Homogeneous Light-Entrance Window", IEEE Transactions on Nuclear Science, vol. 47:No. 4, pp. 1691-1695.

* cited by examiner

*Primary Examiner*—David Porta
*Assistant Examiner*—Faye Boosalis
(74) *Attorney, Agent, or Firm*—Drinker Biddle & Reath LLP; Robert A. Koons, Jr.; Matthew P. McWilliams

(57) ABSTRACT

Described is a semiconductor detector for detecting electromagnetic radiation or particle radiation, comprising a semiconductor body (10) of a first conduction type, comprising first and second main surfaces; a group of drift electrodes comprising a second, opposite, conduction type, with said drift electrodes being arranged on the first main surface for generating at least one drift field in the semiconductor body (10); and a counterelectrode arrangement (30) which is arranged on the second main surface, which comprises the second conduction type and which forms a radiation entry window, wherein the counterelectrode arrangement (30) comprises a two-dimensional main electrode (31) and at least one barrier electrode (32) which are electrically insulated from each other, and wherein the barrier electrode (32), of which there is at least one, is connected to a voltage source (50) and is designed such that a blocking voltage is applied to it relative to the semiconductor body (10), with said blocking voltage exceeding the blocking voltage of the main electrode (31).

14 Claims, 4 Drawing Sheets

SEMICONDUCTOR DETECTOR WITH OPTIMISED RADIATION ENTRY WINDOW

The invention relates to a semiconductor detector for detecting electromagnetic radiation or particle radiation, in particular a semiconductor detector for the detection or the spectroscopy of ionising radiation or charged particles.

It has been well known to use semiconductor drift detectors (also known as semiconductor drift chambers, semiconductor drift diodes, in particular silicon drift detectors, silicon drift chambers or silicon drift diodes) for radiation detection (see e.g. U.S. Pat. No. 4,688,067). A drift detector is a large-area semiconductor component of low capacity which comprises a semiconductor body of a first conduction type, e.g. n-type, whose opposite main surfaces comprise layer-shaped regions of the opposite second conduction type, thus e.g. p-type. These regions form biased barrier layers which are used as electrodes in order to form a defined potential in the semiconductor body, for collecting radiation-generated charge carriers.

Figure 6:
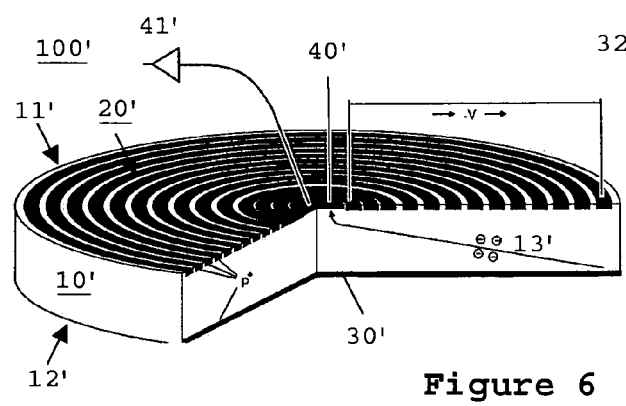

A conventional drift detector, in particular for spectroscopic, i.e. energy-resolved measuring, e.g. of X-ray radiation is diagrammatically shown in FIG. 6. The drift detector 100' comprises a semiconductor body 10', e.g. of the n-type, on whose main surface 11', which in the drawing is located at the top, p-doped drift electrodes 20' are arranged in a ring shape. In the centre of the first main surface 11', a signal electrode 40' (read-out electrode) is provided which forms an ohmic connection to the semiconductor body 10'. On the opposite second main surface 12', a large-area unstructured, blocking-polarised region is provided, which region forms a counterelectrode 30' which is also p-doped. The counterelectrode 30', which represents an area of constant potential, forms a radiation entry window through which the radiation to be detected enters (see e.g. WO 85/04987).

For detector operation the drift electrodes 20' and the counterelectrode 30' are poled in the blocking direction in such a way in relation to the semiconductor body 10' that almost the entire cross section of the semiconductor body 10' is depleted of movable charge carriers, and a potential minimum for majority charge carriers of the first conduction type, i.e. for example electrons, arises in the interior of the semiconductor body 10'. By applying a voltage to the drift electrodes 20', which voltage increases towards the outside, the potential minimum is formed as a continuous potential gradient 13'.

As a result of absorption of ionising radiation in the depleted volume of the semiconductor body 10', majority charge carriers (in this case electrons) are generated which in the electrical field of the potential gradient drift to the signal electrode 40' where they provide a measurement signal. The measurement signal is amplified by means of an amplifier 41', which if need be is integrated in the semiconductor body 10', and is subsequently evaluated. The minority charge carriers (in this case holes) which are generated during radiation absorption are subtracted by the blocking-polarised regions and do not contribute to the signal. Since the capacity of the signal electrode 40' is extremely low, advantageously, the drift detector structure permits a low-noise and fast selection of the signal. Consequently, drift detectors are in particular suited to single photon counting (measuring individual radiation quantum yields or particles), wherein as a result of the use of the two-dimensional counterelectrode 30', homogeneous absorption conditions in the semiconductor body 10' and thus an energetically narrow signal response function of the drift detector with little background are achieved.

However, the use of the unstructured large-area counterelectrode 30' as a radiation entry window is associated with a significant disadvantage for the potential distribution in the interior of the semiconductor body 10' which will be explained below with reference to FIGS. 7A, 7B. FIG. 7A depicts a sectional view of the semiconductor body 10' with the drift electrodes 20' and the counterelectrode 30'. FIG. 7B illustrates the respective potential relationships in the semiconductor body 10'.

If a voltage is applied to the drift electrodes 20' with a voltage gradient between for example −250 V at the outer drift electrode 22' and −10 V at the inner drift electrode 21', and a constant voltage of −125 V is applied to the counterelectrode 30', an almost diagonal progression of the potential minimum 13' in the semiconductor body 10' results. However, on the outer edge of the drift detector, powerful electrical fields arise in relation to the outer non-depleted region, with said electrical fields interfering with the potential gradient in the semiconductor body 10' between the electrodes. In the region of the blocking drift-electrode with the highest-amounting blocking voltage, i.e. at the edge of the sensitive detector surface, a region 14' with almost constant potential and a low electrical field strength arises near the counterelectrode 30' parallel to the second main surface 12'. Due to the low electrical field strength, majority charge carriers which are generated in this region 14' remain for a relatively long time in this almost field-free space. During this dwell time, the spatial distribution of the signal charges is considerably extended by diffusion. As a result of this, the charge collection time extends and consequently the signal rise time also extends. As a result of this, a spatially inhomogeneous response function of the drift detector is formed. The measurement signals can be used only to a limited extent for spectroscopic evaluation.

Figure 7:
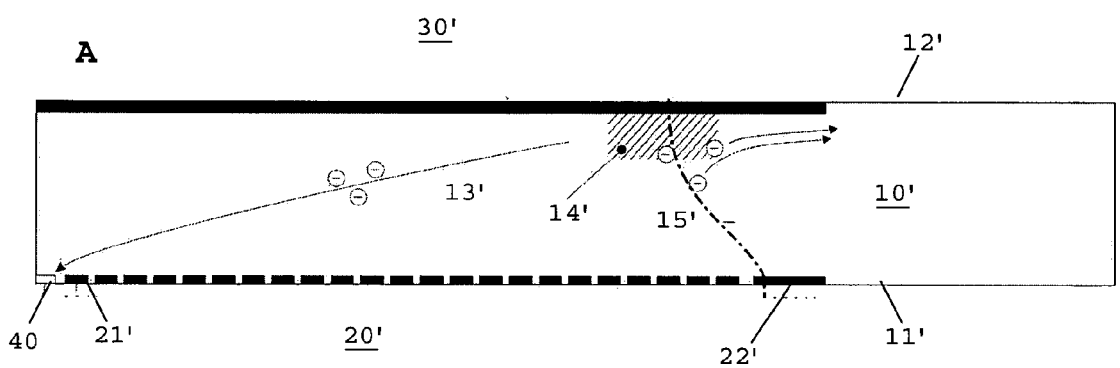
Figure 7:
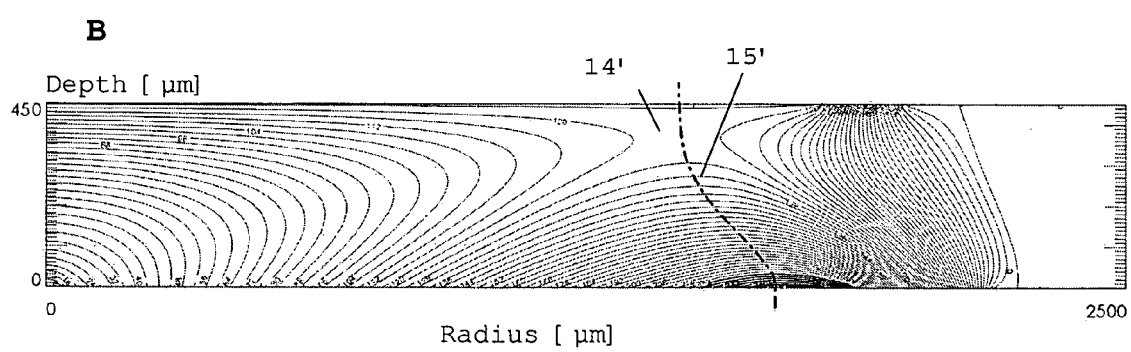

There is a further problem in that on the outer edge of the drift detector near the radiation entry side (counterelectrode 30') no potential barrier or only a slight potential barrier exists in relation to the non-depleted outer region of the semiconductor body. The low potential barrier to the non-depleted region favours a partial loss of signal charges. In FIG. 7 a dot-dash line 15' shows the progression of the boundary along which the generated charge carriers either flow into the depleted region to the signal electrode 40' or become lost towards the edge of the detector. There is a further disadvantage in that due to the strong electrical fields at the edge of the detector the boundary 15' is shifted to the semiconductor body 10' underneath the counterelectrode 30'. Consequently, charge carriers can be lost to measurement, although they were generated underneath the radiation entry window.

Both these disadvantageous effects—namely the variations in the signal rise time depending on the location where the charge carriers were generated, and the signal charge losses—have an adverse effect on the energy resolution of the drift detector. In the case of conventional drift detectors, there have been attempts to eliminate the absorption of ionising radiation and thus to eliminate the act of generating charge carriers in the field-free regions by covering the edge region by means of a collimator. However, the incorporation of a collimator with a technically-caused adjustment tolerance results in a considerable loss of sensitive detector surface. The relationship of geometric detector surface to effectively useable detector surface is adversely affected.

Furthermore, multichannel drift detectors are known in which a multitude of detector structures are arranged side by side as detector cells, according to FIG. 6 for example in a honeycomb-shape. While for all detector cells a common counterelectrode has been provided, each individual detector cell comprises its own signal electrode. This makes possible simultaneous energy-selective detection of individual radiation quanta. In the case of multichannel drift detectors, the above-mentioned problems occur not only at the detector edge but also along the cell boundaries. At the cell boundaries, from which in each instance potential gradients commence leading to the signal electrodes in the centre of the adjacent cells, near the surface almost field-free regions arise in which the charge collection time is increased. Furthermore, signal charges can drift off to neighbouring detector cells, thus falsifying the measurement signal.

Apart from occurring in the edge regions of a detector or on the cell boundaries of multichannel detectors, the above-mentioned disadvantage of a loss of signal charge carriers can also occur if in the upper main surface 11' within the drift electrodes 20' additional detector components are integrated which result in a region of locally reduced charge-carrier collection efficiency. Such regions can for example arise as a result of the integration of elements of the amplifier electronics.

It is the object of the invention to provide an improved semiconductor detector with which the disadvantages of conventional detectors can be overcome, with the improved semiconductor detector featuring increased effectiveness, reproducibility and accuracy of radiation detection. In particular, the detector is to maintain the advantages of using an unstructured radiation entry window (large-area counterelectrode) while avoiding the disadvantages of the field-free regions described above. It is a particular object of the invention to provide an improved semiconductor detector which features improved use of the area of the radiation entry window and thus improved detection effectiveness. The detector is in particular to be suitable for energy resolved measurements with a narrow spectral response function with little low-energy background.

These objects are solved by a semiconductor detector with the characteristics according to claim 1. Advantageous embodiments and applications of the invention have been provided in the dependent claims.

A basic idea of the invention consists of improving a semiconductor detector for detecting electromagnetic radiation or particle radiation with a semiconductor body (semiconductor substrate) on whose main surfaces on one side the drift electrodes and on the other side a counterelectrode arrangement as biased barrier layers have been formed, to the effect that the counterelectrode arrangement comprises a two-dimensional unstructured main electrode and at least one barrier electrode which in relation to the semiconductor body is polarised more strongly in the direction of blocking than is the main electrode. The main electrode and the barrier electrode, of which there is at least one, form the radiation entry window of the semiconductor detector according to the invention. Advantageously, the area of the radiation entry window, which area is useable for detection, is enlarged by making the field-free regions smaller and by shifting them into the depths of the semiconductor body, and by a sharpening of the gradients at the boundary between depleted and non-depleted regions of the semiconductor body as a result of the effect of the at least one barrier electrode. The operation of the at least one barrier electrode is explained below with further details.

In this specification, a two-dimensional main electrode which has been formed in an unstructured way refers to an electrode layer or a group of electrically interconnected electrode layers, respectively having an area which corresponds to the area which a group of drift electrodes on the opposite surface of the semiconductor body take up, and which in each case form a closed layer without partial structures.

According to the invention the semiconductor electrodes (drift electrodes and counterelectrodes) can be p-doped, while the semiconductor body is n-doped. As an alternative, the semiconductor electrodes can be n-doped, while the semiconductor body is p-doped.

According to a preferred embodiment of the invention, the main electrode in the plane of the second main surface of the semiconductor body is entirely or partially enclosed by the barrier electrode. For example, in a single-channel drift detector, the barrier electrode forms a ring around the main electrode. As an alternative, according to the invention, it can be provided for the at least one barrier electrode, to enclose piece by piece individual partial regions (cell regions) of the main electrode, either entirely or in part. This design is for example provided in the case of multichannel drift detectors. With the use of barrier electrodes which enclose partial regions of the main electrode according to the dimensions of the detector cells, improved allocation of the detected charge carriers to the individual cells is achieved.

The at least one barrier electrode can be interrupted by a conductive bridge which is insulated relative to the barrier electrode, such that an electrical connection is formed from one cell region of the main electrode to other cell regions or from a non-doped region between the barrier electrode and the main electrode with the semiconductor body. Interconnecting various partial regions of the main electrode can be of practical advantage in particular when the main electrodes of a multichannel drift detector are connected to an external voltage supply. Interconnection of the non-doped region to the semiconductor body can be advantageous for preventing thermally generated leakage currents or dark currents.

According to a modified embodiment of the invention, the at least one barrier electrode can be arranged in the second main surface in regions which are located opposite to further potential-influencing elements (e.g. layer-shaped circuit components such as for example a signal-amplifying transistor) on the first main surface. Advantageously, the charge carrier collection time and charge carrier effectiveness can be improved in this way.

According to a further preferred embodiment of the invention, the at least one barrier electrode comprises a lateral width (extension in the plane of the second main surface) which is at least equal to a quarter of the amount of the thickness of the semiconductor body. In this way, the field-free region (saddle point) can be shifted from the surface to the depths of the semiconductor body. In this way the signal charge losses can advantageously be reduced since during absorption of electromagnetic radiation most charge carriers are generated near the surface.

According to the invention, the at least one barrier electrode can comprise doped semiconductor material of the second conduction type, or as an alternative it can comprise metal so that a Schottky junction to the semiconductor body is formed. The first variant can have advantages in relation to the production of the barrier electrode, preferably with the same doping material as the main electrode.

According to the invention it can be provided for the main electrode to be without any electrical connection to other potential-carrying components of the detector. In this design, the main electrode is operated in a "floating" state, which can result in advantages in relation to simplification of the detector design.

According to a further modification, additional shielding electrodes or so-called guard electrodes can be provided outside the radiation entry window which is formed by the main electrode and the at least one barrier electrode. The shielding electrodes can have an advantageous effect on the prevention of strong electrical fields at the detector edge.

Advantageously, the semiconductor detector according to the invention has a wide field of application in the detection of and in the spectroscopic, i.e. energy-resolved, measurement of ionising radiation (e.g. charged particles) or electromagnetic radiation in the spectral range of gamma, X-ray, UV radiation or visible light. A preferred application consists of the creation of a drift detector for X-ray spectroscopy. As an alternative, the semiconductor detector according to the invention can also form a PAD detector or any other pixel-based semiconductor detector.

Figure 1:
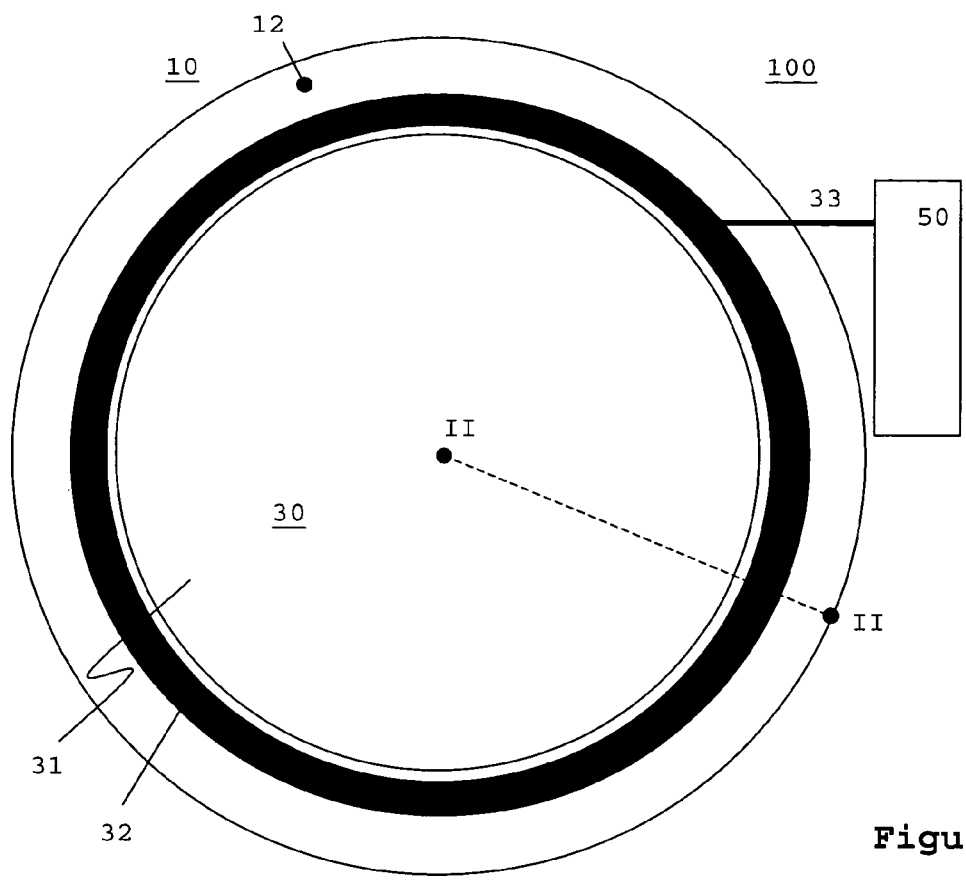
Figure 3:
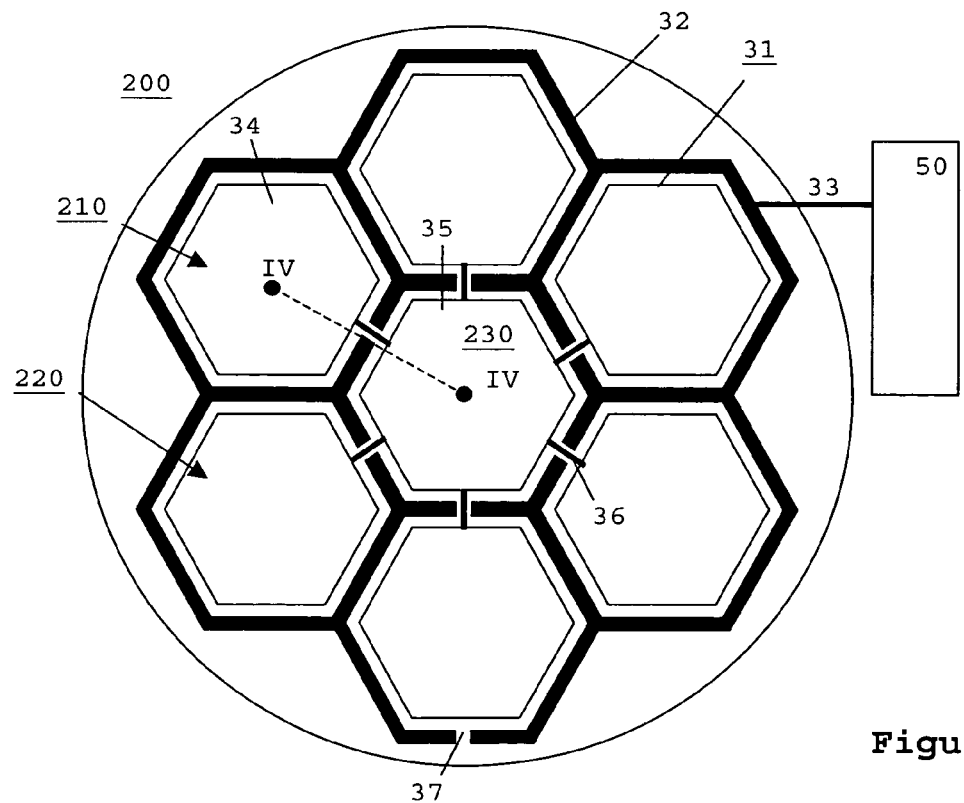
Figure 2:
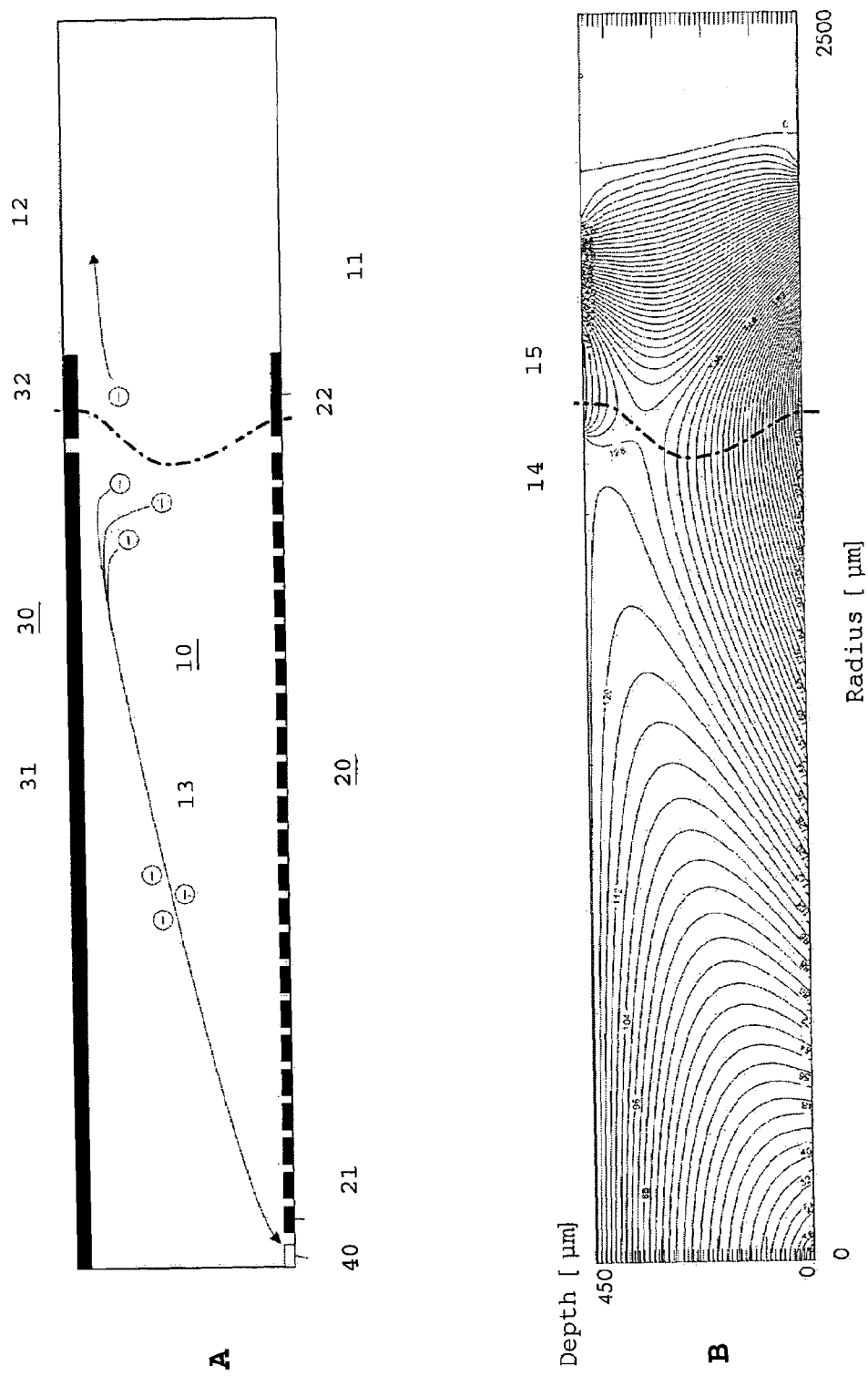
Figure 4:
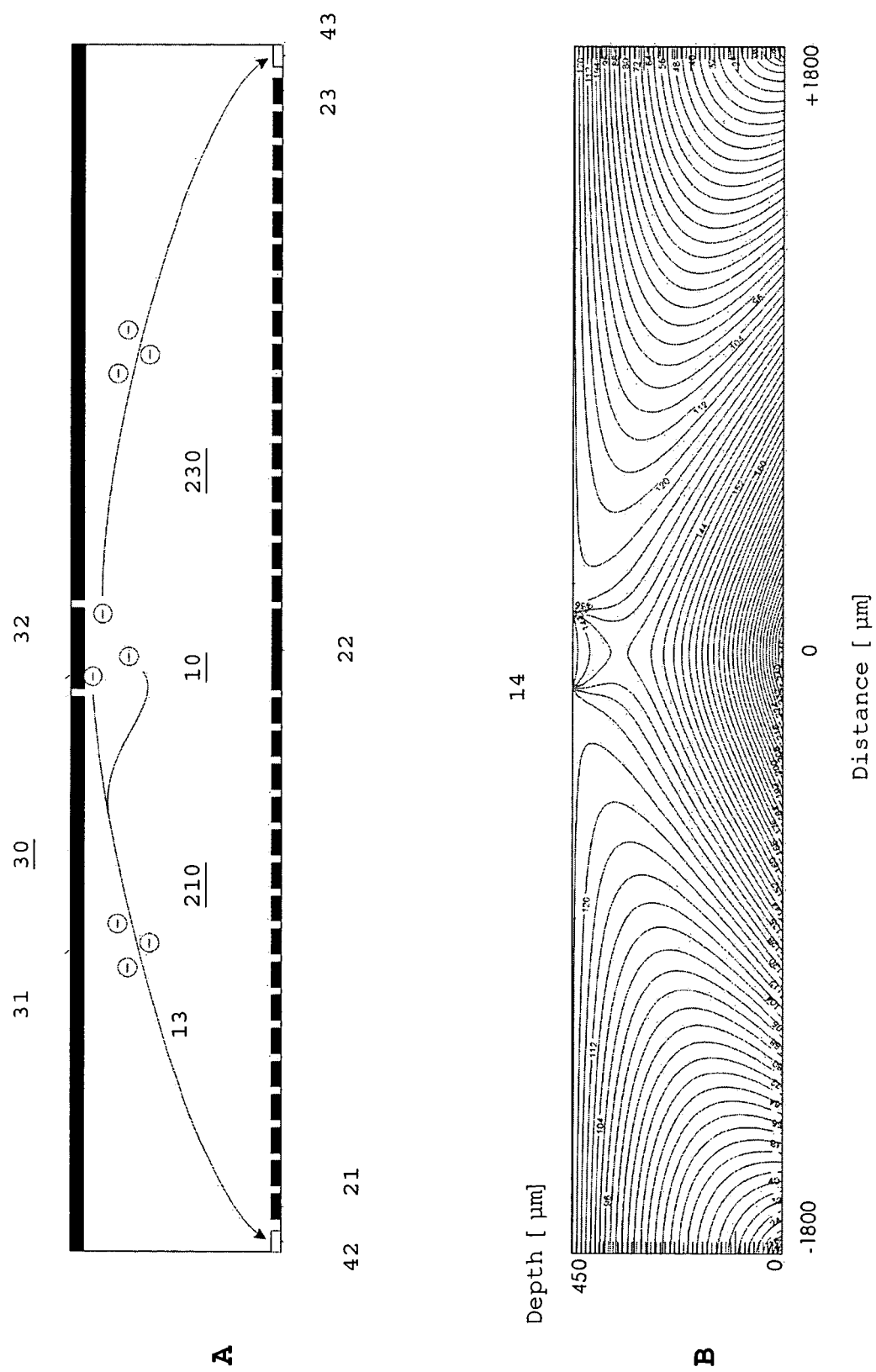
Figure 5:
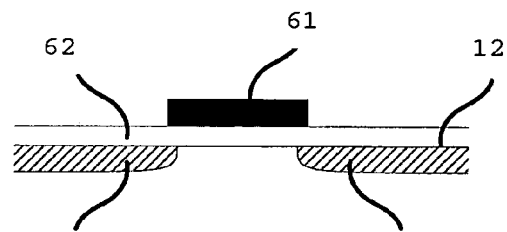

Further advantages and details of the invention are described below with reference to the enclosed drawings. The following are shown:

FIG. 1 a diagrammatic top view of a single-channel detector according to the invention;

FIGS. 2A, B illustrations of the potential relationships in the detector according to FIG. 1 along the line II—II;

FIG. 3 a diagrammatic top view of a multichannel detector according to the invention;

FIGS. 4A, B illustrations of the potential relationships in the detector according to FIG. 3 along the line IV—IV;

FIG. 5 a diagrammatic illustration of the arrangement of field plates; and

FIGS. 6, 7 illustrations of the design and the potential relationships of a conventional drift detector.

Below, the invention is described by way of example, with reference to a semiconductor drift detector for X-ray spectroscopy. However, the invention is not limited to this application; instead, it can be correspondingly applied in the case of other semiconductor detectors. The invention is in particular characterised by the design of the radiation entry window of a semiconductor detector comprising a counterelectrode and at least one barrier electrode. Further characteristics of semiconductor detectors, such as e.g. the design of the semiconductor body, the drift electrodes, the read-out electrodes, or further circuit components are known per se from conventional semiconductor detectors and are therefore not described in detail in this specification.

By way of example, FIG. 1 shows a diagrammatic, enlarged top view of a drift detector 100 with a view to the second main surface 12 with the radiation entry window 30. The drift detector 100 is designed as a single-channel detector with cylinder symmetry according to the design, which is known per se, of a standard single drift detector. The radiation entry window 30 has been provided as a counterelectrode arrangement of the drift detector 100 instead of the counterelectrode 30' for example of a conventional drift detector according to FIG. 5. According to the invention, the radiation entry window 30 comprises the two-dimensional unstructured main electrode 31 and the ring-shaped barrier electrode 32 which surrounds the main electrode 31. Both electrodes 31, 32 are formed as doped barrier layers on one of the main surfaces of the semiconductor body 10. The electrodes 31, 32 are arranged so as to be spaced apart from each other. Between them there is an insulating ring made of non-doped semiconductor material.

According to the invention, the barrier electrode 32 is connected to a voltage source 50 by way of the electrical interconnection line 33. The voltage source 50 has been provided to apply a barrier voltage to the barrier electrode 32, which barrier voltage exceeds the barrier voltage of the main electrode 31 relative to the semiconductor body 10.

The semiconductor body 10 is for example n-conducting silicon while the electrodes 31, 32 comprise the opposite conduction type, i.e. the p-conduction. The electrodes 31, 32 are preferably formed by doping the semiconductor material on the basis of which the semiconductor body has been produced. As an alternative, the semiconductor body can e.g. comprise germanium, gallium arsenide, cadmium telluride or cadmium zinc telluride.

Preferably, the thickness of the semiconductor body 10 is selected to be between 200 µm and 500 µm. The dimension of the main electrode 31 is for example between 1 mm and 5 mm. The lateral width of the barrier electrode 32 is for example 100 µm; it is selected at least such that contact with an interconnection line 33 is possible. Preferably, the lateral width is at least equal to a quarter of the thickness of the semiconductor body 10. At a thickness of e.g. 450 µm, the width is for example approximately 225 µm. The insulating distance between the electrodes is for example 10 µm in width. The total area of the radiation entry window 30 is for example 12 mm².

Below, the effect of the barrier electrode 32 is explained with reference to FIGS. 2A, B. FIG. 2A shows an enlarged sectional view of the drift detector according to FIG. 1 along the line II—II. On the first main surface 11 of the semiconductor body 10, the drift electrodes 20 and the signal electrode 40 are arranged. On the opposite second main surface 12, the main electrode 31 and the barrier electrode 32 are located, with the barrier electrode 32 being connected to the voltage source. The drift electrodes 20 on the one hand, and the electrodes 31, 32 on the other hand take up an almost identical area. For the purpose of radiation detection, for example the following voltages are set in the operating state of the drift detector: main electrode 31: −125 V; barrier electrode 32: −150 V; drift electrodes 20: voltage gradient rising from −10 V at the innermost drift electrode 21 to −250 V at the outermost drift electrode 22. The voltage gradient at the drift electrodes is set such that a potential gradient 13, which essentially extends diagonally through the semiconductor body 10, forms for collecting the radiation-generated charge carriers.

FIG. 2B shows the respective potential relationships. Free charge carriers move perpendicularly in relation to the drawn lines of constant potential. The majority charge carriers (in the present example electrons) flow along the potential minimum 13 to the signal electrode 40 (read-out electrode) in the middle of the semiconductor body 10, while the minority charge carriers flow almost perpendicularly to the two main surfaces 11, 12. In the areas where there is a high density of potential lines, there is a strong electrical field which accelerates the charge carriers.

As a result of the effect of the barrier electrode 32, in contrast to the potential pattern of the conventional drift detector according to FIG. 6, according to the invention there is a definite reduction in the extent of the almost field-free region 14 and thus a faster drift from majority charge carriers generated in that location to the read-out electrode 40. The signal transit times from this critical region are shortened. Furthermore, the potential barrier (through which the majority charge carriers could diffuse into the non-depleted region of the semiconductor body 10) and thus the effective detector surface are enlarged. Advantageously, the potential separation line 15 (dot-dash line) penetrates less deeply into the semiconductor body 10 underneath the radiation entry window 30. In comparison to a conventional drift detector, the effectively useable area of the radiation entry window 30 is enlarged. Moreover, the potential barrier is sharpened so that the locations where charge carriers are generated, at which locations the drift direction is at first undetermined, are smaller.

There is an important advantage in that the saddle point of the field-free region 15 is shifted into the depths of the semiconductor body 10 underneath the second main surface 12. Since in particular in the detection of electromagnetic radiation the absorption probability of photons and thus the frequency of charge carrier generation processes exponentially decreases in line with the distance radiated-through and thus most of the charge carriers are generated directly below the surface, the shift of the region 15 into the depths causes a significant reduction in the number of charge carriers which are generated at all in the region 15. The shift of the region 15 into the depths of the semiconductor body 10 approximately corresponds to the lateral width of the barrier electrode.

There is a particular advantage in that even charge carriers which are generated outside the main electrode 31 underneath the barrier electrode 32, partly contribute to the measurement signal since the potential separation line only ends underneath the barrier electrode 32. When compared to the conventional image, there is an increase in the useable area of approx. 20%. The charge-carrier collection efficiency is drastically improved.

FIG. 3 shows a modified embodiment of a drift detector 200 according to the invention, wherein said drift detector 200 is formed as a multichannel detector comprising a multitude of detector cells 210, 220, 230 . . . which are arranged in a honeycomb-like manner. The diagrammatic top view of the second main surface 12 shows a radiation entry window 30 comprising a main electrode 31 and a barrier electrode 32. The main electrode 31 comprises a number of hexagonal electrode layers corresponding to the number of detector cells. The hexagonal electrode layers are also called cell regions 34, 35, . . . . The cell regions 34, 35, . . . are electrically interconnected by way of electrically conducting interconnection bridges (e.g. at 36), which are insulated from the barrier electrode 32 so that all cell regions of the main electrode 31 have a common potential.

The barrier electrode 32 is composed of a multitude of straight electrode strips which in hexagonal shape enclose the cell regions of the main electrode 31. The barrier electrode 32 is connected to the voltage source 50 by way of the connection line 33. The size of the cell regions and the width of the electrode strip have been selected analogous to the dimensioning according to FIG. 1. FIGS. 4A, B show an enlarged sectional view along the line IV—IV and the associated potential relationships.

FIG. 4A shows the adjoining halves of the detector cells 210, 230 on whose first main surface 12, analogous to the example described above, drift electrodes 20 and the signal electrodes 42, 43 are arranged; and on whose second main surface the main electrode 31 and the barrier electrode 32 are arranged. During detector operation, the following potentials are applied to the electrodes: main electrode 31: −125 V; barrier electrode 32: −150 V; drift electrodes: voltage gradients ranging from the lowest blocking voltages of −10 V at the drift electrodes 21, 23 which are adjacent to the signal electrodes 42, 43, to the maximum blocking voltage of −250V in the middle drift electrode 22 at the cell boundary between the adjacent detector cells 210, 230. In the completely depleted n-conducting substrate, diagonally aligned potential gradients 13 form at whose minima the charge carriers are collected to the signal electrodes 42, 43.

The effect of the barrier electrode 32 is shown in the potential image of FIG. 4B. The almost field-free region 14 with the saddle point between the potential gradients has been reduced in size and shifted to the depths of the semiconductor body 10. Furthermore, the potential barrier between the adjacent detector cells is sharpened. Advantageously, in this way, detected partial events which belong to the one photon can better be separated during signal evaluation.

Drift detectors according to the invention can comprise the following further characteristics. In addition, for reducing the potential in relation to the surroundings, outer shielding rings can be provided around the radiation entry window 30. At the radiation entry window a collimator can be arranged, which, however, in contrast to collimators on conventional detectors leaves a larger area free as a sensitive detector area.

Furthermore, it can be provided for all surface regions of the semiconductor body 10 in the plane of the second main surface 12 between the main electrodes and barrier electrodes 31, 32 to be electrically interconnected, and for the potential of these surface areas as well as the interruptions (see for example FIG. 3, reference characters 36, 37) of the barrier electrode to be determined by means of field plates, for example in a design comprising metal-oxide semiconductor elements (61, 62, see FIG. 5). Advantageously, in this way leakage currents, which can increasingly occur in these regions as a result of defect-supported thermal generation of charge carriers, can be conducted away to the non-depleted region of the semiconductor body, and thus the energy resolution of the detector can be improved.

The barrier electrode, of which there is at least one, can be arranged in the second main surface, for example in the middle where opposite on the first main surface on the signal electrode for example an amplifying transistor is provided which can cause reduced charge collection efficiency in a locally delimited region.

The characteristic features of the invention which have been disclosed in the description, the drawings and the claims can be of importance to the realisation of the invention in its various embodiments both individually and in combination.

The invention claimed is:

1. A semiconductor detector for detecting electromagnetic radiation or particle radiation, comprising:
   a semiconductor body of a first conduction type, comprising first and second main surfaces;
   a group of drift electrodes comprising a second, opposite conduction type and being arranged on the first main surface for generating at least one drift field in the semiconductor body; and
   a counterelectrode arrangement arranged on the second main surface forming a radiation entry window,
   the counterelectrode arrangement comprising a two-dimensional unstructured main electrode and at least one barrier electrode which are electrically insulated from each other,
   wherein the at least one barrier electrode is connected to a voltage source and is arranged such that a blocking voltage can be applied to it relative to the semiconductor body, with said blocking voltage exceeding a blocking voltage of the main electrode, and
   wherein the at least one barrier electrode lies in the plane of the second main surface opposite to the outermost of the drift electrodes and entirely or partially encloses the main electrode.

2. The semiconductor detector according to claim 1, wherein the at least one barrier electrode in the plane of the second main surface entirely or partially encloses cell regions of the main electrode.

3. The semiconductor detector according to claim 2, wherein the at least one barrier electrode partially encloses the cell regions such that in the barrier electrode at least one interruption with a conductive bridge is formed, said bridge electrically interconnecting the said cell regions.

4. The semiconductor detector according to claim 1, wherein the at least one barrier electrode partially encloses the main electrode such that in the barrier electrode an interruption wit a conductive bridge is formed, said bridge electrically interconnecting the surface regions of the semiconductor body in the plane of the second main surface between the main electrodes and barrier electrodes.

5. The semiconductor detector according to claim 1, wherein surface regions of the semiconductor body in the plane of the second main surface between the main electrodes and barrier electrodes or the interruptions of the barrier electrode are entirely or partially covered with field plates.

6. The semiconductor detector according to claim 1, wherein the at least one barrier electrode lies in the plane of the second main surface and is arranged in regions opposite to regions of reduced charge collection efficiency on the first main surface.

7. The semiconductor detector according to claim 1, wherein the at least one barrier electrode comprises a lateral width which is at least equal to a quarter of the thickness of the semiconductor body.

8. The semiconductor detector according claim 1, wherein the at least one barrier electrode comprises doped semiconductor material of the second conduction type.

9. The semiconductor detector according to claim 1, wherein the at least one barrier electrode comprises metal and forms a Schottky junction to the semiconductor body.

10. The semiconductor detector according to claim 1, wherein the main electrode is arranged without electrical connection to other potential-carrying components of the detector.

11. The semiconductor detector according to claim 1, wherein shielding electrodes are provided outside the radiation entry window.

12. The semiconductor detector according to claim 1, comprising a drift detector for X-ray spectroscopy.

13. The semiconductor detector according to claim 12, wherein the drift detector comprises a multichannel detector with several adjoining detector cells.

14. The semiconductor detector according to claim 1, which comprises a PAD detector for particle detection.

* * * * *